United States Patent [19]

Rokos

[11] Patent Number: 4,659,998
[45] Date of Patent: Apr. 21, 1987

[54] VOLTAGE FOLLOWER

[75] Inventor: George H. S. Rokos, Bishops Stortford, England

[73] Assignee: STC plc, London, England

[21] Appl. No.: 730,562

[22] Filed: May 6, 1985

[30] Foreign Application Priority Data

May 11, 1984 [GB] United Kingdom ............... 8412036

[51] Int. Cl.⁴ ........................... H03F 3/45; H03F 1/26
[52] U.S. Cl. ..................................... 330/260; 330/149
[58] Field of Search ............... 330/252, 259, 260, 261, 330/149

[56] References Cited

U.S. PATENT DOCUMENTS 4,335,359  6/1982  Kriedt et al. .................. 330/260

Primary Examiner—Gene Wan
Attorney, Agent, or Firm—Kerkam, Stowell, Kondracki & Clarke

[57] ABSTRACT

For a voltage follower unity gain amplifier, used, for instance, as a buffer in a transceiver associated with a data bus, the input signal is fed forward to a comparator (T2-T3) to which the output is also applied. The input is also applied via an amplifier stage (T5-T6) to a transistor (T4) in the commoned circuit of the comparator, which is a long-tailed pair. Thus, with a connection from the output of the circuit which includes another transistor (T9), provides negative feedback round the comparator, gives a highly stable current.

8 Claims, 1 Drawing Figure

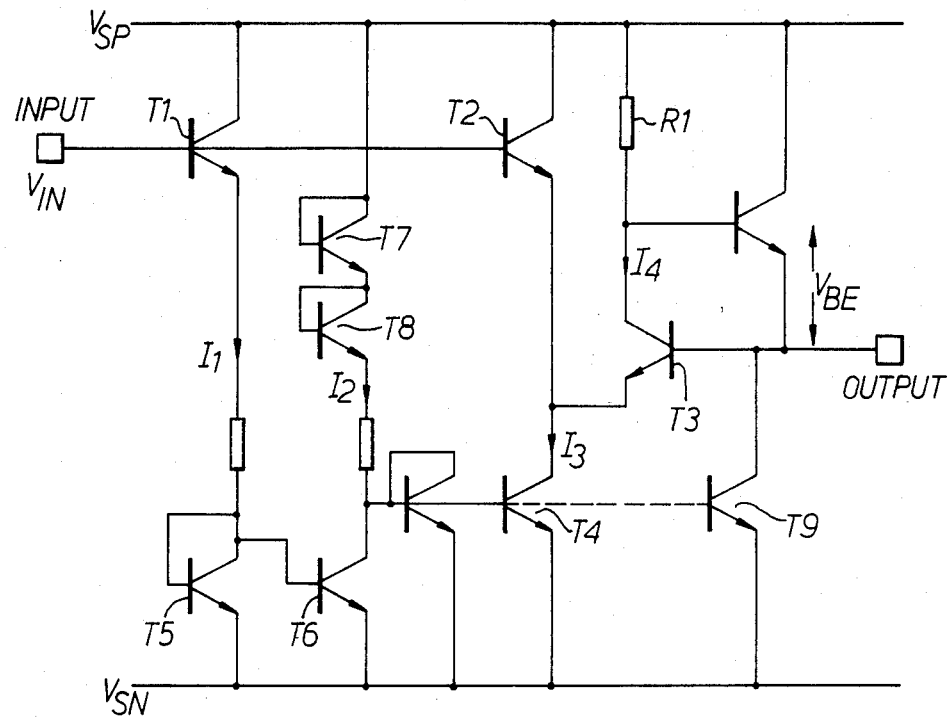

VOLTAGE FOLLOWER

This invention relates to a transistorised voltage follower circuit, intended for integrated circuit implementation, but also applicable to discrete circuit implementation.

PRIOR ART

British Pat. No. 1043596 (North Americal Aviation Inc.) describes a circuit for use with an amplifier which may be a zero gain amplifier which includes a comparator of the long-tailed pair type with one input connected to a circuit input and the other input connected to the circuit output. Thus it compares the input and output voltages of the comparator. The associated amplifier is so connected to the output that the current flow in the amplifier is varied in a feedback loop to the common connection of the long-tailed pair type comparator.

British Pat. No. 1591524 (IBM) relates to an amplifier in which negative feedback techniques are used to stabilise the amplifier. This circuit has a pair of field effect transistors (FETs) with their source drain path in parallel, with a constant current regulator in series therewith. An amplifier is connected to the junction of the two FETs and the regulator, and its output is connected back to the gate of one of the FETs, the other FET's gate being connected to the input. The amplifier in this case inverts. Thus here also we have a comparator function.

Another circuit of some interest is shown in an article "Voltage-followers for D.C. Voltmeters", by P. Williams in "Electronic Engineering", May, 1969. Here we have a long-tailed pair with the input and output connected to the bases of the transistors and a transistor amplifier with a base connected to the collector of the "input" transistor of the pair and the collector connected to the output. Here also the comparator effect is used to stabilise the circuit.

SUMMARY OF THE INVENTION

According to the invention there is provided a voltage follower circuit, which includes a comparator stage which compares the input and the output signals of the circuit, the result of said comparison being used to control the current in the output of the circuit, and an amplifier stage to which the input signals are also applied and whose output is applied via the comparator stage to the output of the circuit, so that the circuit's output is derived from the output of the comparator stage, wherein as a result of the connection of the output of the amplifier stage via the comparator stage to the output of the circuit the differential current produced due to any difference between the input and output signal amplitudes is effective to adjust the amplification provided by the amplifier stage, and wherein a negative feedback connection is provided around the comparator stage to reinforce circuit accuracy.

Thus the general principle of using a comparator in conjunction with feedback techniques is extended in an advantegeous manner to give a circuit which, while being relatively economical is highly accurate as a voltage follower.

BRIEF DESCRIPTION OF THE DRAWING

An embodiment of the invention will now be described with reference to the accompanying drawing, which shows a voltage follower circuit for use in a data bus transceiver.

DESCRIPTION OF THE PREFERRED EMBODIMENT

A transceiver of the type referred to above is intended for use, inter alia, in local area networks, where it is connected to a data bus which conveys pulsed intelligence, usually at high bit rates. Hence a fast and accurate response to such intelligence is needed. such a voltage follower, of course, has other applications, e.g. for use as a buffer connected to a computer's digital highway, and in broadband active filters.

In the arrangement shown, which is used as a buffer for a voltage reference the input is applied to the bases of two transistors T1 and T2, of which T1 is the first transistor of an amlifier stage, and T2 is one transistor of a circuit of long-tailed pair type functioning as a comparator. The other transistor of the comparator, T3, has its base connected to the circuit output. Hence T2-T3 compare the input signal and the output signal, producing a current through another transistor T4 whose value depends on the difference (if any) between these signals.

The amplifier includes another transistor T5, connected as a diode, which with a resistor is in series with T1, and a transistor T6 connected across the power supply, in series with two diode-connected transistors T7 and T8 and another resistor. The currents $I_1$ and $I_2$, which flow in T1-T5 and in T7-T8-T6 respectively are subtracted to define the long-tailed pair current $I_3$, which flows in the transistor T4. The values of the resistors and the mirror ratios for the transistors T2-T3 are so chosen that:

$$I_{32}R_1 + V_{BE} = V_{SP} - V_{IN}$$

Thus the output voltage would, roughly, track the input voltage, even in the absence of feedback. Negative feedback round the long-tailed pair, T2-T3, completes the circuit, which ensures excellent tracking of the output of the input. The short feedback loop thus provided allows stable operation without necessitating compensation capacitors, and the circuit can be implemented in all current bipolar integrated circuit techniques. It can also be implemented using PNP transistors, instead of NPN transistors as shown. Further, the basic principle is readily converted to NMOS operation, as well as to other sorts of integrated circuit.

Maximum slew rates of the circuit are limited by $I_3$, R1 and parasitic capacitances, rather than by loop parameters which are dominant in conventional circuits.

Current to the output stage can conveniently be made to track the required output voltage by the use of a further transistor T9, as shown. This reduces the effect of output loading on the amplifier gain, which may be readily held within 0.1% of unity.

Thus the use of feedforward to the comparator stage provides wide dynamic range without needing to add PNP current mirrors to the NPN transistors used.

It will be noted that in the drawing, the transistors T1-T5-T6-T7-T8, of which T7 and T8 are diode-connected, together form the amplifier. T2 and T3 together form the comparator, with the negative feedback connection effective round T2 and T3 via T9-T4 etc.

I claim:
1. A voltage follower circuit, which includes an input via which input signals to the circuit are received, an output at which output signals of the circuit occur, an amplifier stage to which the input signals are applied from said input, a comparator stage having first and second inputs, an output from the amplifier stage being applied to the first input of the comparator stage so that the input signals to the circuit reach the first input of the comparator stage via the amplifier stage, a connection between the output of the voltage follower circuit and the second input of the comparator stage via which the circuit's output signals are applied to the comparator stage for comparison thereby with the input signals to the circuit, and circuit means associated with the output of the voltage follower circuit whereby the result of said comparison is used to control the current which flows to the output of the circuit in response to the application of said input signals to the circuit's input, wherein as a result of the connection of the output of the amplifier stage via the comparator stage to the output of the voltage follower circuit the differential current produced due to any difference in magnitude between the input signal and the output signal is effective to adjust the amplification provided by the amplifier stage, and wherein a negative feedback connection is provided around the comparator stage from an output of the comparator stage to the amplifier stage to reinforce circuit accuracy.

2. A voltage follower circuit as claimed in claim 1, wherein the output voltage which would be present at the output of the circuit in the absence of said negative feedback connection is derived as a result of a current which flows in a resistor which controls that output voltage, and wherein the resistor is also connected to a power supply input such that the current in said resistor is derived from the difference between the voltage of the power supply and the voltage of the input signals applied to the voltage follower's input.

3. A circuit as claimed in claim 1, wherein the comparator stage is a long-tailed pair formed by two transistors with their emitters connected together and to the collector of a third transistor which forms the common load of the long-tailed pair, and wherein the output of the amplifier is connected to the base of the further transistor.

4. A circuit as claimed in claim 3 wherein the comparator stage is a long-tailed pair comprising two transistors having their emitters connected together and to the collector a third transistor, said third transistor being the common load of the long-tailed pair, and wherein the output of the amplifier is connected to the base of the first transistor.

5. A circuit as claimed in claim 4, and which includes a fourth transistor whose collector-emitter path is connected from the output of the circuit to one side of the power supply, the base of the fourth transistor being connected to the base of the third transistor.

6. A circuit as claimed in claim 5, and wherein the amplifier includes fifth and sixth transistors with the emitter of the fifth transistor connected to the base of the sixth transistor, the input being applied to the base of the fifth transistor, and a connection from the collector of the sixth transistor to the base of the third transistor.

7. A circuit as claimed in claim 6, and which includes a diode-connected transistor connected in series with the fifth transistor and thus across the base-emitter path of the sixth transistor.

8. A circuit as claimed in claim 6, and which includes diode-connected transistor means connected in series across the power supply with the emitter-collector path of the sixth transistor.

* * * * *